United States Patent
Shi

(10) Patent No.: US 12,087,790 B2
(45) Date of Patent: Sep. 10, 2024

(54) PHOTOELECTRIC CONVERSION CIRCUIT, DRIVING METHOD, PHOTOELECTRIC DETECTION SUBSTRATE, AND PHOTOELECTRIC DETECTION DEVICE

(71) Applicant: BOE Technology Group Co., Ltd., Beijing (CN)

(72) Inventor: Lubin Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 562 days.

(21) Appl. No.: 17/486,799

(22) Filed: Sep. 27, 2021

(65) Prior Publication Data

US 2022/0173142 A1    Jun. 2, 2022

(30) Foreign Application Priority Data

Nov. 27, 2020  (CN) .......................... 202011361232.1

(51) Int. Cl.
*H01L 27/146* (2006.01)
(52) U.S. Cl.
CPC .. *H01L 27/14614* (2013.01); *H01L 27/14643* (2013.01); *H01L 27/14689* (2013.01)
(58) Field of Classification Search
CPC ......... H01L 27/14614; H01L 27/14643; H01L 27/14689
See application file for complete search history.

(56) References Cited

U.S. PATENT DOCUMENTS

| 5,539,461 | A | * | 7/1996 | Andoh | ................. | H04N 25/766 |
| | | | | | | 257/E27.141 |
| 2004/0036789 | A1 | * | 2/2004 | Shinohara | ......... | H01L 27/14609 |
| | | | | | | 348/308 |
| 2005/0248674 | A1 | * | 11/2005 | Mabuchi | .............. | H04N 25/778 |
| | | | | | | 348/308 |

(Continued)

FOREIGN PATENT DOCUMENTS

| CN | 105913792 A | 8/2016 |
| CN | 109559686 A | 4/2019 |

(Continued)

OTHER PUBLICATIONS

CN202011361232.1 first office action.

*Primary Examiner* — Blake C Riddick
(74) *Attorney, Agent, or Firm* — IPro, PLLC

(57) ABSTRACT

Disclosed are a photoelectric conversion circuit, a driving method, a photoelectric detection substrate, a photoelectric detection device, and a first reset circuit supplies a signal of initialization signal terminal to a gate of driving transistor in response to a signal of reset control signal terminal. A conduction control circuit conducts a photoelectric conversion device with driving transistor in response to a signal of scan signal terminal, a threshold compensation circuit conducts gate of the driving transistor and a second electrode of driving transistor in response to signal at the scan signal terminal to compensate for a threshold voltage of driving transistor. A read control circuit conducts a first power supply terminal with first and second electrodes of driving transistor with a read output terminal in response to a signal of read control signal terminal to output a threshold voltage compensated signal generated by driving transistor to the read output terminal.

19 Claims, 6 Drawing Sheets

(56) References Cited

U.S. PATENT DOCUMENTS

| | | | | |
|---|---|---|---|---|
| 2005/0258341 | A1* | 11/2005 | Nishikawa | G02F 1/13318 257/E31.074 |
| 2006/0226339 | A1* | 10/2006 | Roh | H01L 27/14609 250/214.1 |
| 2007/0023788 | A1* | 2/2007 | Yasui | H01L 27/14609 348/E3.019 |
| 2007/0126904 | A1* | 6/2007 | Kimura | G01N 21/64 348/E3.018 |
| 2008/0074524 | A1* | 3/2008 | Panicacci | H04N 25/59 348/E3.019 |
| 2008/0105905 | A1* | 5/2008 | Kang | H01L 27/14609 257/431 |
| 2008/0315068 | A1* | 12/2008 | Kanda | H04N 25/76 250/200 |
| 2009/0225206 | A1* | 9/2009 | Oike | H04N 25/76 327/333 |
| 2009/0289174 | A1* | 11/2009 | Koyama | G01J 1/4204 250/214 DC |
| 2010/0238310 | A1* | 9/2010 | Shizukuishi | H04N 25/531 348/308 |
| 2010/0238338 | A1* | 9/2010 | Shizukuishi | H04N 25/77 257/E31.097 |
| 2010/0308208 | A1* | 12/2010 | Sano | H04N 25/617 327/56 |
| 2010/0328478 | A1* | 12/2010 | Tanaka | H01L 27/14676 348/E5.025 |
| 2011/0001711 | A1* | 1/2011 | Choi | G06F 3/0412 345/173 |
| 2011/0042551 | A1* | 2/2011 | Ha | H04N 25/626 250/208.1 |
| 2011/0084322 | A1* | 4/2011 | Kang | H01L 27/14689 257/292 |
| 2011/0215861 | A1* | 9/2011 | Kurokawa | H04N 25/75 257/E31.085 |
| 2011/0226935 | A1* | 9/2011 | Kawahito | H04N 25/573 250/208.2 |
| 2012/0092536 | A1* | 4/2012 | Hirota | H01L 27/1464 348/294 |
| 2014/0027768 | A1* | 1/2014 | Kurokawa | H01L 29/7869 257/43 |
| 2014/0043510 | A1* | 2/2014 | Kasuga | H04N 25/75 348/300 |
| 2014/0339432 | A1* | 11/2014 | Sekine | H04N 5/32 250/366 |
| 2015/0281607 | A1* | 10/2015 | Jakobson | H04N 25/671 250/214 P |
| 2016/0027827 | A1* | 1/2016 | Sekine | H04N 25/78 257/43 |
| 2016/0037106 | A1* | 2/2016 | Ohmaru | H04N 5/32 348/143 |
| 2016/0266702 | A1* | 9/2016 | Yang | G09G 3/2092 |
| 2016/0366360 | A1* | 12/2016 | Okamoto | H04N 5/147 |
| 2017/0162121 | A1* | 6/2017 | Yang | G06F 3/007 |
| 2017/0168648 | A1* | 6/2017 | Takahashi | G06F 3/0412 |
| 2017/0208272 | A1* | 7/2017 | Guidash | H01L 27/1461 |
| 2017/0214871 | A1* | 7/2017 | Kanehara | H04N 25/702 |
| 2017/0221420 | A1* | 8/2017 | Zhu | G09G 3/3233 |
| 2018/0020176 | A1* | 1/2018 | Kim | H04N 25/75 |
| 2018/0202861 | A1* | 7/2018 | Ma | G01T 1/24 |
| 2018/0234655 | A1* | 8/2018 | Yang | H04N 25/60 |
| 2018/0249102 | A1* | 8/2018 | Miyake | H04N 25/76 |
| 2018/0270430 | A1* | 9/2018 | Yang | H04N 25/76 |
| 2018/0359435 | A1* | 12/2018 | Yang | H04N 25/76 |
| 2019/0073950 | A1* | 3/2019 | Yang | G09G 3/20 |
| 2019/0147797 | A1* | 5/2019 | Yuan | H10K 59/123 345/76 |
| 2019/0253659 | A1* | 8/2019 | Kobayashi | H04N 25/79 |
| 2019/0279566 | A1* | 9/2019 | Wang | G09G 3/3233 |
| 2019/0281242 | A1* | 9/2019 | Cheng | H04N 25/78 |
| 2019/0313048 | A1* | 10/2019 | Cheng | H04N 25/772 |
| 2020/0043417 | A1* | 2/2020 | Yang | G06V 40/1306 |
| 2020/0242321 | A1* | 7/2020 | Cao | G09G 5/10 |
| 2021/0056901 | A1 | 2/2021 | Ueno | |
| 2021/0201727 | A1 | 7/2021 | Ma | |
| 2022/0052101 | A1* | 2/2022 | Yao | G06V 40/1318 |
| 2022/0391034 | A1* | 12/2022 | Huang | G06F 3/0412 |

FOREIGN PATENT DOCUMENTS

| | | |
|---|---|---|
| CN | 109870470 A | 6/2019 |
| CN | 110824328 A | 2/2020 |
| WO | 2019186764 A1 | 10/2019 |

* cited by examiner

PHOTOELECTRIC CONVERSION CIRCUIT, DRIVING METHOD, PHOTOELECTRIC DETECTION SUBSTRATE, AND PHOTOELECTRIC DETECTION DEVICE

CROSS-REFERENCE TO RELATED APPLICATION

This application is based on and claims priority under 35 U.S.C 119 to Chinese Patent Application No. 202011361232.1, filed on Nov. 27, 2020, in the China National Intellectual Property Administration. The entire disclosure of the above application is incorporated herein by reference.

FIELD

The present disclosure relates to the field of photoelectric technology, in particular to a photoelectric conversion circuit, a driving method, a photoelectric detection substrate, and a photoelectric detection device.

BACKGROUND

With the development of technology, image sensors have been widely used. A photodiode L is generally provided in the image sensor to collect a light signal by the photodiode L and perform photoelectric conversion to convert the light signal into an electric signal. In general, a driving transistor M0 used in conjunction with the photodiode L may be provided to convert an electrical signal converted by the photodiode L into a current signal and then the driving transistor M0 outputs the current signal to a driving IC (Integrated Circuit). Later, the driving IC performs processing according to the received current signal.

SUMMARY

Embodiments of the present disclosure provide a photoelectric conversion circuit, including:
a photoelectric conversion device, configured to receive incident light and generate an operating voltage after photoelectric conversion of the incident light;
a driving transistor, configured to generate a detection current according to the operating voltage photoelectrically converted by the photoelectric conversion device;
a first reset circuit, configured to supply a signal of an initialization signal terminal to a gate of the driving transistor in response to a signal of a reset control signal terminal;
a conduction control circuit, configured to conduct the photoelectric conversion device with the driving transistor in response to a signal at a scan signal terminal;
a threshold compensation circuit, configured to conduct the gate of the driving transistor with a second electrode of the driving transistor in response to the signal at the scan signal terminal; and
a read control circuit, configured to conduct a first power supply terminal with a first electrode of the driving transistor and the second electrode of the driving transistor with a read output terminal in response to a signal of a read control signal terminal.

In some embodiments, the conduction control circuit includes: a first transistor;
a gate of the first transistor is electrically connected to the scan signal terminal, a first electrode of the first transistor is electrically connected to the photoelectric conversion device, and a second electrode of the first transistor is electrically connected to a first electrode of the driving transistor.

In some embodiments, the threshold compensation circuit includes: a second transistor;
a gate of the second transistor is electrically connected to the scan signal terminal, a first electrode of the second transistor is electrically connected to a gate of the driving transistor, and a second electrode of the second transistor is electrically connected to a second electrode of the driving transistor.

In some embodiments, the first reset circuit includes: a third transistor;
a gate of the third transistor is electrically connected to the reset control signal terminal, a first electrode of the third transistor is electrically connected to the initialization signal terminal, and a second electrode of the third transistor is electrically connected to the gate of the driving transistor.

In some embodiments, the read control circuit includes: fourth and fifth transistors;
a gate of the fourth transistor is electrically connected to the read control signal terminal, a first electrode of the fourth transistor is electrically connected to the first power supply terminal, and a second electrode of the fourth transistor is electrically connected to a first electrode of the driving transistor;
a gate of the fifth transistor is electrically connected to the read control signal terminal, a first electrode of the fifth transistor is electrically connected to a second electrode of the driving transistor, and a second electrode of the fifth transistor is electrically connected to the read output terminal.

In some embodiments, the photoelectric conversion circuit further includes: a storage capacitor;
a first electrode plate of the storage capacitor is electrically connected to the first power supply terminal, and a second electrode plate of the storage capacitor is electrically connected to a gate of the driving transistor.

In some embodiments, the photoelectric conversion circuit further includes: a sixth transistor; wherein a gate of the sixth transistor is electrically connected to the reset control signal terminal, a first electrode of the sixth transistor is electrically connected to a reference signal terminal, and a second electrode of the sixth transistor is electrically connected to the photoelectric conversion device.

Embodiments of the present disclosure provide a photoelectric detection substrate, including: a base substrate, a plurality of detection units; wherein the plurality of detection units are arranged on the base substrate in an array; and
each of the detection units includes the photoelectric conversion circuit.

In some embodiments, the photoelectric detection substrate further includes a plurality of scan signal lines, a plurality of reset control signal lines, and a plurality of read control signal lines positioned on the base substrate and spaced apart from one another; wherein one row of the detection units correspond to one scan signal line, one reset control signal line, and one read control signal line;
reset control signal terminals of the photoelectric conversion circuits in each row of the detection units are electrically connected to a corresponding reset control signal line;
scan signal terminals of the photoelectric conversion circuits in each row of the detection units are electrically connected to a corresponding scan signal line; and read control signal terminals of the photoelectric conversion circuits in each row of the detection units are electrically connected to a corresponding read control signal line.

In some embodiments, the photoelectric detection substrate further includes a plurality of read output lines arranged on the base substrate and spaced apart from one another; wherein one column of the detection units corresponds to one read output line;

the read output terminals of the photoelectric conversion circuits in each column of the detection units are electrically connected to a corresponding read output line.

Embodiments of the present disclosure provide a photoelectric detection device that includes the photoelectric detection substrate described above.

In some embodiments, a detection circuit is further included;

the detection circuit includes a plurality of read circuits; wherein a column of the detection units correspond to one of the read circuits;

the read output terminals of the photoelectric conversion circuits in each column of the detection units are electrically connected to a corresponding read circuit through a read output line.

According to an embodiment of the present disclosure, a method for driving a photoelectric conversion circuit is provided, including:

a reset stage in which a first reset circuit supplies a signal at an initialization signal terminal to a gate of the driving transistor in response to a signal at a reset control signal terminal;

a light-detection stage of receiving, by the photoelectric conversion device, incident light and generating an operating voltage after photoelectric conversion of the incident light;

a threshold compensation stage of conducting, by the conduction control circuit, the photoelectric conversion device with the driving transistor in response to a signal at a scan signal terminal; conducting, by the threshold compensation circuit, the gate of the driving transistor with the second electrode of the driving transistor in response to a signal at the scan signal terminal; and a read output stage of generating, by the driving transistor, a detection current according to an operating voltage photoelectrically converted by the photoelectric conversion device; conducting, by the read control circuit, a first power supply terminal with the first electrode of the driving transistor and conducing the second electrode of the driving transistor with a read output in response to a signal from a read control signal terminal.

DETAILED DESCRIPTION OF THE EMBODIMENTS

Figure 1:
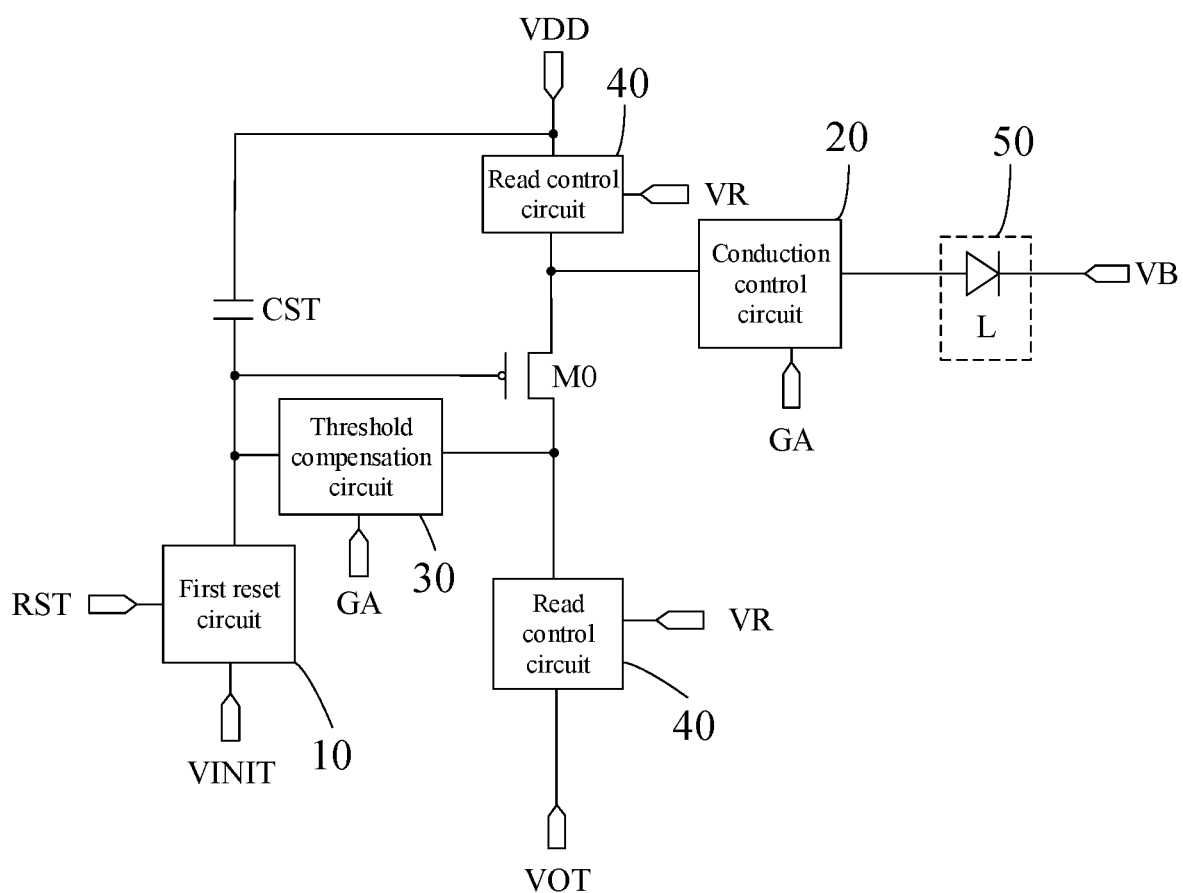
FIG. 1 is a schematic diagram illustrating a structure of a photoelectric conversion circuit in an embodiment of the present disclosure.

In order to make the objectives, solutions and advantages of embodiments of the present disclosure more clear, solutions of embodiments of the present disclosure will now be clearly and completely described in conjunction with the accompanying drawings of embodiments of the present disclosure. Clearly, the described embodiments are some, but not all, embodiments of the disclosure. The embodiments of the disclosure and features of the embodiments may be combined with each other without conflict. Based on the described embodiments of the present disclosure, all other embodiments obtained by those of ordinary skill in the art without inventive effort shall fall within the scope of protection of the present disclosure.

Unless otherwise defined, technical or scientific terms used in the present disclosure should have a general meaning understood by those of ordinary skill in the art to which the present invention pertains. The terms "first," "second," and the like used in the present disclosure do not denote any order, quantity, or importance, but are only used to distinguish different components. Similar words such as "including" or "comprising" mean that the elements or objects appearing before the word cover the enumerated elements or objects appearing after the word and their equivalents, without excluding other elements or objects. Words like "connected" or "connecting" are not limited to physical or mechanical connections, but may include electrical connections, whether direct or indirect.

It should be noted that the sizes and shapes of the figures in the drawings do not reflect a true scale, but are merely illustrative of the disclosure. The same or similar reference numerals throughout refer to the same or similar elements or elements having the same or similar function.

Embodiments of the present disclosure provide a photoelectric conversion circuit, as shown in FIG. 1, and the circuit may include:

an photoelectric conversion device 50, configured to receive incident light and generate an operating voltage after photoelectric conversion of the incident light;

a driving transistor M0, configured to generate a detection current according to the operating voltage photoelectrically converted by the photoelectric conversion device 50;

a first reset circuit 10, configured to supply a signal of an initialization signal terminal VINIT to a gate of the driving transistor M0 in response to a signal of a reset control signal terminal RST;

a conduction control circuit 20, configured to conduct the photoelectric conversion device 50 with the driving transistor M0 in response to a signal at a scan signal terminal GA;

a threshold compensation circuit 30, configured to conduct the gate of the driving transistor M0 with a second electrode of the driving transistor M0 in response to the signal at the scan signal terminal GA; and a read control circuit 40, configured to conduct the first power supply terminal VDD with a first electrode of the driving transistor M0 and the second electrode of the driving transistor M0 with a read output terminal VOT in response to a signal of a read control signal terminal VR.

An embodiment of the present disclosure provides a photoelectric conversion circuit that can initialize the gate of the driving transistor M0 by supplying the signal of the initialization signal terminal VINIT to the gate of the driving transistor M0 in response to the signal of the reset control signal terminal RST through the first reset circuit 10. The threshold voltage of the driving transistor M0 may be compensated by conducting the photoelectric conversion device 50 with the driving transistor M0 in response to the signal at the scan signal terminal GA by the conduction control circuit 20, and conducting the gate of the driving transistor M0 and the second electrode of the driving transistor M0 by the threshold compensation circuit 30 in response to the signal at the scan signal terminal GA. Thereafter, the signal of the read control signal terminal VR may be responded to by the read control circuit 40, the first power supply terminal VDD is conducted with the first electrode of the driving transistor M0, and the second electrode of the driving transistor M0 is conducted with the read output terminal VOT, so that the threshold voltage compensated signal generated by the driving transistor M0 can be output to the read output terminal VOT, which in turn can ameliorate the problem of variability in the output current signal due to the difference in uniformity of the threshold voltage Vth of the driving transistor.

In some embodiments of the present disclosure, the photoelectric conversion device 50 may be a photodiode L. A positive electrode of the photodiode L is electrically connected to the conduction control circuit 20, and the negative electrode of the photodiode L is electrically connected to a bias voltage terminal VB. Alternatively, a negative electrode of the photodiode L may be electrically connected to the conduction control circuit 20 and the positive electrode of the photodiode L may be electrically connected to the bias voltage terminal VB. In this way, a bias voltage can be provided for the photodiode L via the bias voltage terminal VB. Exemplarily, the photoelectric conversion device 50 may be a PIN photodiode L.

It should be noted that the voltage of the bias voltage terminal VB can be changed such that the positive electrode of the photodiode L can be connected to the bias voltage terminal VB, or the positive electrode of the photodiode L is connected to the bias voltage terminal VB. Of course, the specific voltage value of the bias voltage terminal VB can be determined by design according to the requirements of the actual application and is not limited herein.

In some embodiments of the present disclosure, as shown in FIG. 1, the driving transistor M0 may be a P-type transistor; wherein a first electrode of the driving transistor M0 is a source electrode and a second electrode of the driving transistor M0 is a drain electrode, and current flows from the source electrode of the driving transistor M0 to its drain electrode when the driving transistor M0 is in saturation.

Of course, in specific implementation, the driving transistor M0 may also be an N-type transistor in embodiments of the present disclosure; wherein a first electrode of the driving transistor M0 is a drain electrode and a second electrode of the driving transistor M0 is its source electrode, and current flows from the drain electrode of the driving transistor M0 to its source electrode when the driving transistor M0 is in saturation.

Figure 2:
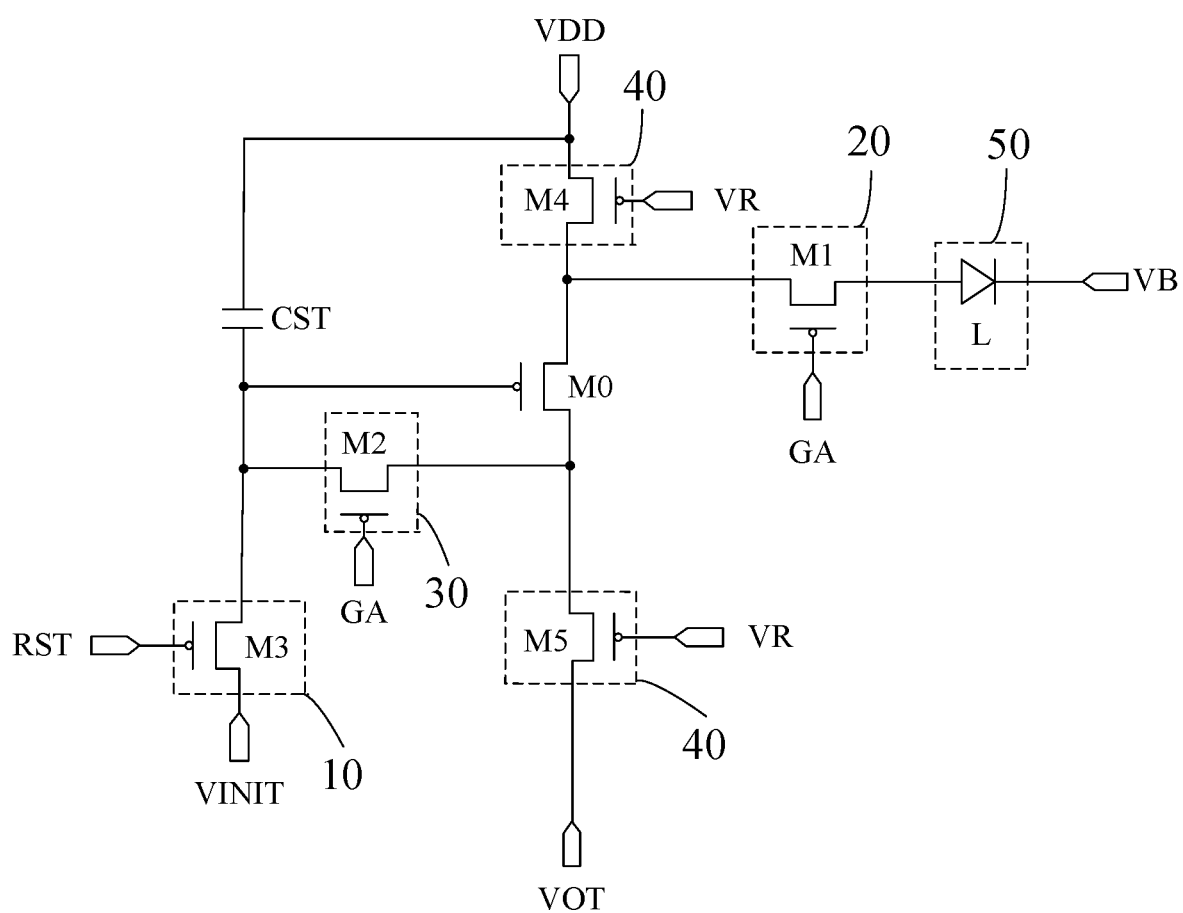
FIG. 2 is a schematic diagram illustrating some specific structures of the photoelectric conversion circuit in an embodiment of the present disclosure.

In some embodiments of the present disclosure, as shown in FIG. 2, the conduction control circuit 20 may include: a first transistor M1; wherein a gate of the first transistor M1 is electrically connected to the scan signal terminal GA, a first electrode of the first transistor M1 is electrically connected to the photoelectric conversion device 50, and a second electrode of the first transistor M1 is electrically connected to a first electrode of the driving transistor M0. For example, a first electrode of the first transistor M1 is electrically connected to a positive electrode of the photodiode L.

In some embodiments of the present disclosure, as shown in FIG. 2, the threshold compensation circuit 30 may include: a second transistor M2; wherein, a gate of the second transistor M2 is electrically connected to the scan signal terminal GA, a first electrode of the second transistor M2 is electrically connected to the gate of the driving transistor M0, and a second electrode of the second transistor M2 is electrically connected to the second electrode of the driving transistor M0.

In some embodiments of the present disclosure, as shown in FIG. 2, the first reset circuit 10 may include: a third transistor M3; wherein, a gate of the third transistor M3 is electrically connected to the reset control signal terminal RST, a first electrode of the third transistor M3 is electrically connected to the initialization signal terminal VINIT, and a second electrode of the third transistor M3 is electrically connected to the gate of the driving transistor M0.

In some embodiments of the present disclosure, as shown in FIG. 2, the read control circuit 40 may include: fourth and fifth transistors M4, M5; wherein, a gate of the fourth transistor M4 is electrically connected to the read control signal terminal VR, a first electrode of the fourth transistor M4 is electrically connected to the first power supply terminal VDD, and a second electrode of the fourth transistor M4 is electrically connected to the first electrode of the driving transistor M0. A gate of the fifth transistor M5 is electrically connected to the read control signal terminal VR, a first electrode of the fifth transistor M5 is electrically connected to the second electrode of the driving transistor M0, and a second electrode of the fifth transistor M5 is electrically connected to the read output terminal VOT.

In some embodiments of the present disclosure, as shown in FIG. 2, the photoelectric conversion circuit may further include: a storage capacitor CST; wherein, a first electrode plate of the storage capacitor CST is electrically connected to the first power supply terminal VDD and a second electrode plate of the storage capacitor CST is electrically connected to the gate of the driving transistor M0.

Alternatively, in order to reduce the fabrication process, in specific implementation, the first transistor to the fifth transistor M5 may each be a P-type transistor in an embodiment of the present disclosure, as shown in FIG. 2. Of course, the first transistor to the fifth transistor M5 may also all be N-type transistors, which may also be determined by design depending on the actual application environment, which is not limited here.

Further, in some embodiments of the present disclosure, the P-type transistor is cut off by a high level signal and conducted by a low level signal. An N-type transistor is conducted by a high-level signal and cut off by a low-level signal.

It should be noted that the transistors mentioned in the above embodiments of the present disclosure may be Thin Film Transistors (TFTs) or Metal Oxide Semiconductors (MOSs), which is not limited here.

In specific implementation, depending on the type of transistor and the signal of its gate, a first electrode of the transistor may be used as its source electrode and a second electrode as its drain electrode; alternatively, and vice versa, the transistor has its first electrode as its drain electrode and its second electrode as its source electrode, which can be determined by design according to the actual application context, and is not particularly distinguished here.

The above is merely exemplary of the specific structure of each of the photoelectric conversion circuits provided by embodiments of the present disclosure. In particular, the specific structure of the above-described circuit is not limited to the above-described structure provided by the embodiment of the present disclosure, but may be any other structure known to those skilled in the art, which is within the scope of protection of the present disclosure and are specifically not limited herein.

Figure 3:
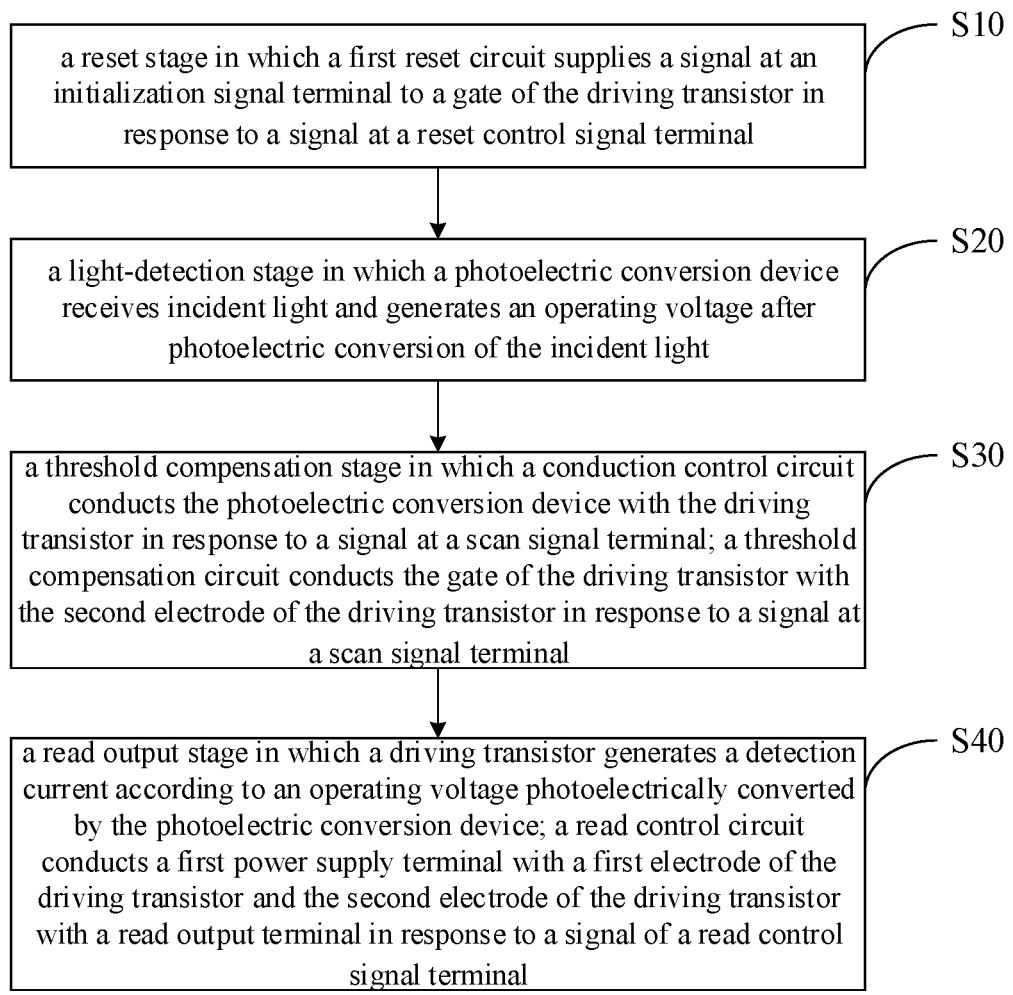
FIG. 3 is a flow diagram illustrating a method for driving the photoelectric conversion circuit in an embodiment of the present disclosure.

Embodiments of the present disclosure also provide a method for driving the photoelectric conversion circuit described above, as shown in FIG. 3, may include the following steps:

S10, a reset stage in which the first reset circuit 10 supplies the signal of the initialization signal terminal VINIT to the gate of the driving transistor M0 in response to the signal of the reset control signal terminal RST;

S20, a light-detection stage in which the photoelectric conversion device 50 receives incident light and generates an operating voltage after photoelectric conversion of the incident light;

S30, a threshold compensation stage in which the conduction control circuit 20 conducts the photoelectric conversion device 50 with the driving transistor M0 in response to the signal at the scan signal terminal GA; the threshold compensation circuit 30 conducts the gate of the driving transistor M0 with the second electrode of the driving transistor M0 in response to the signal at the scan signal terminal GA; and S40, a read output stage in which the driving transistor M0 generates a detection current according to an operating voltage photoelectrically converted by the photoelectric conversion device 50; the read control circuit 40 conducts the first power supply terminal VDD with the first electrode of the driving transistor M0 and the second electrode of the driving transistor M0 with the read output terminal VOT in response to the signal of the read control signal terminal VR.

Figure 4:
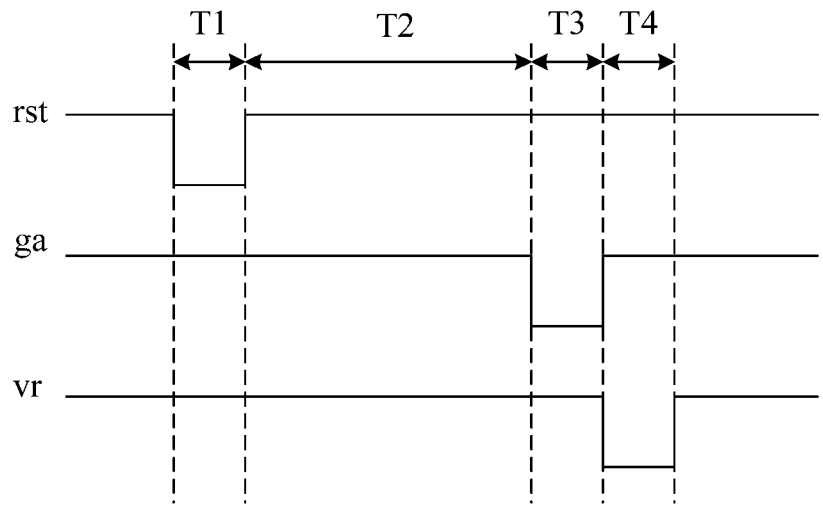
FIG. 4 is a signal timing diagram in an embodiment of the present disclosure.

The operation of the above-described photoelectric conversion circuit according to an embodiment of the present disclosure will be described below by using the photoelectric conversion circuit shown in FIG. 2 as an example with reference to the signal timing diagram shown in FIG. 4. As shown in FIG. 4, rst represents a signal at the reset control signal terminal RST, ga represents a signal at the scan signal terminal GA, and vr represents a signal at the read control signal terminal VR. Furthermore, the operation of one photoelectric conversion circuit in one display frame may include a reset stage T1, a light-detection stage T2, a threshold compensation stage T3, and a read output stage T4.

In the reset stage T1, the third transistor M3 is conducted under the control of a low level of the signal rst to supply the signal of the initialization signal terminal VINIT to the gate of the driving transistor M0 to bring the voltage of the gate of the driving transistor M0 to Vinit to initialize the gate of the driving transistor M0. Furthermore, the first transistor M1 and the second transistor M2 are both cut off under control of the high level of the signal ga. The fourth transistor M4 and the fifth transistor M5 are both cut off under the control of the high level of the signal vr.

In the light-detection stage T2, both the first transistor M1 and the second transistor M2 are cut off under control of the high level of the signal ga. The fourth transistor M4 and the fifth transistor M5 are both cut off at the control of the high level of the signal vr. The third transistor M3 is cut off under the control of the high level of the signal rst. The photodiode L receives an optical signal of incident light to photoelectrically convert the received incident light to generate an operating voltage to enable the photodiode L to perform a collection process of charge.

In the threshold compensation stage T3, the first transistor M1 is conducted under the control of the low level of the signal ga to conduct the positive electrode of the photodiode L with the first electrode of the driving transistor M0 so as to supply the operating voltage VL generated by the photodiode L to the first electrode of the driving transistor M0 so that the voltage of the first electrode of the driving transistor M0 is VL. In addition, the second transistor M2 is conducted under control of the low level of the signal ga, so that the driving transistor M0 forms a diode connection manner, so that the voltage VL of the first electrode of the driving transistor M0 charges the gate of the driving transistor M0, the voltage of the gate of the driving transistor M0 is VL+Vth, and is stored by the storage capacitor CST. The fourth transistor M4 and the fifth transistor M5 are cut off under the control of the high level of the signal vr. The third transistor M3 is cut off under the control of the high level of the signal rst.

In the read output stage T4, the fourth transistor M4 is conducted under the control of the low level of the signal vr, the conducted fourth transistor M4 may supply the voltage Vdd of the first power supply terminal VDD to the first electrode of the driving transistor M0, so that the voltage of the first electrode of the driving transistor M0 is Vdd. This may put the driving transistor M0 in saturation, thereby causing the driving transistor M0 to produce a detection current Ids: $Ids=K(VL-Vdd)^2$. The fifth transistor M5 is conducted under the control of the low level of the signal vr, the conducted fifth transistor M5 may conduct the second electrode of the driving transistor M0 with the read output terminal VOT to output the detection current Ids by conduction of the read output terminal VOT. K is a structural constant related to the process and design. The first transistor M1 and the second transistor M2 are cut off under the control of a high level of the signal ga, and the third transistor M3 is cut off under the control of a high level of the signal rst.

By the above formula $Ids=K(VL-Vdd)^2$, the detection current Ids generated by the driving transistor M0 is only related to the voltage Vdd and the voltage VL, and is independent of the threshold voltage Vth of the driving transistor M0, and the influence on the detection current due to the shift in the threshold voltage Vth of the driving transistor M0 can be solved, so that the detection current remains stable and thus the accuracy of the result is guaranteed.

Figure 5:
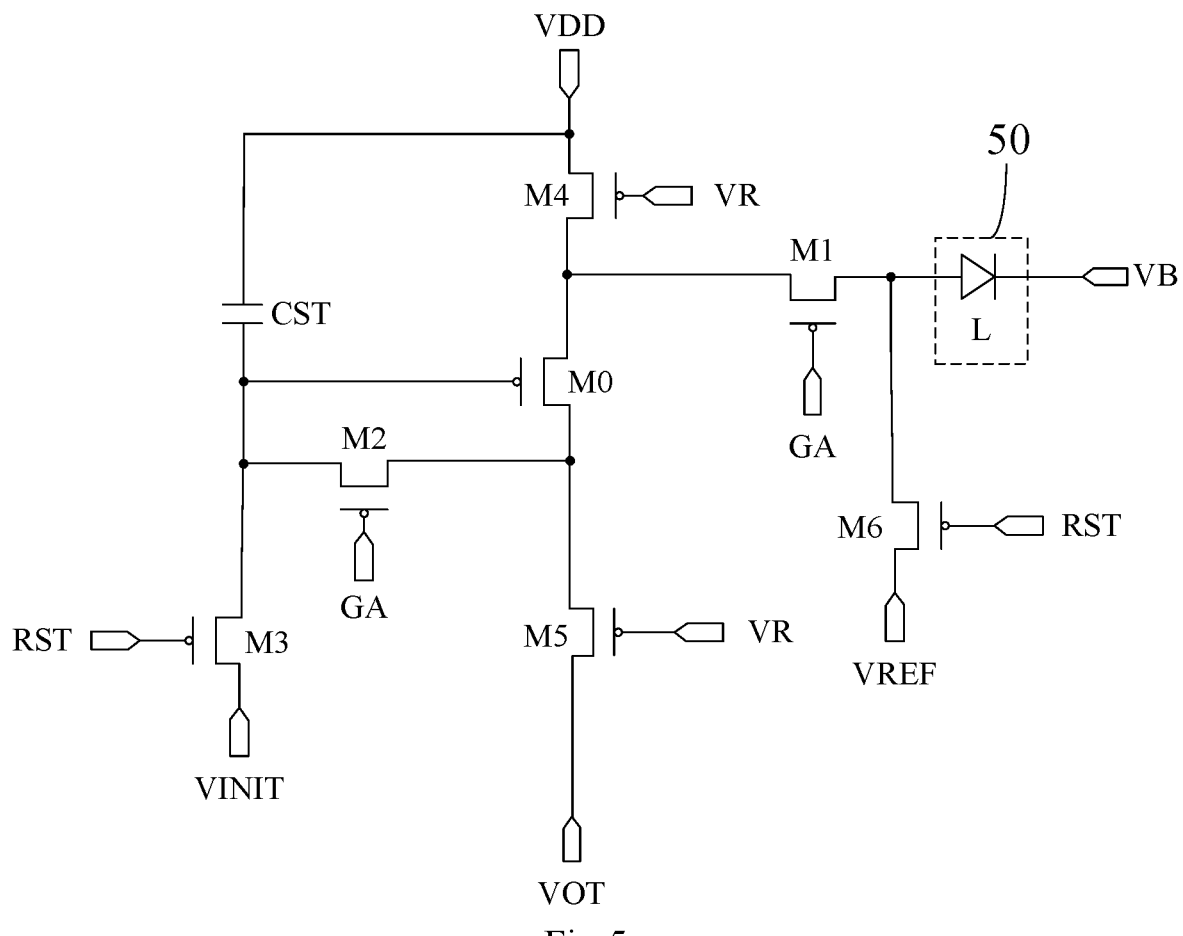
FIG. 5 is a schematic diagram illustrating other specific structures of a photoelectric conversion circuit in an embodiment of the present disclosure.

Embodiments of the present disclosure provide yet further photoelectric conversion circuits having a structural schematic diagram as shown in FIG. 5, which are modified for implementation in embodiments described above. Only the differences of the present embodiment from the above-described embodiments will now be described, and the same will not be repeated here.

In some embodiments of the present disclosure, as shown in FIG. 5, the photoelectric conversion circuit may further include: a sixth transistor M6; wherein, a gate of the sixth transistor M6 is electrically connected to the reset control signal terminal RST, a first electrode of the sixth transistor M6 is electrically connected to the reference signal terminal, and a second electrode of the sixth transistor M6 is electrically connected to the photoelectric conversion device 50. For example, the second electrode of the sixth transistor M6 is electrically connected to the positive electrode of the photodiode L.

A signal timing diagram corresponding to the photoelectric conversion circuit shown in FIG. 5 is shown in FIG. 4. Only the differences between the operation process of the photoelectric conversion circuit illustrated in FIG. 5 and that of the above-described embodiment will be described below, and the same will not be repeated.

In the reset stage T1, the sixth transistor M6 is conducted under the control of the low level of the signal rst to supply the signal at the reference signal terminal to the positive electrode of the photodiode L to reset the positive electrode of the photodiode L.

In the light detection stage T2, the threshold compensation stage T3, and the read output stage T4, the sixth transistor M6 is cut off under control of the high level of the signal rst.

Figure 6:
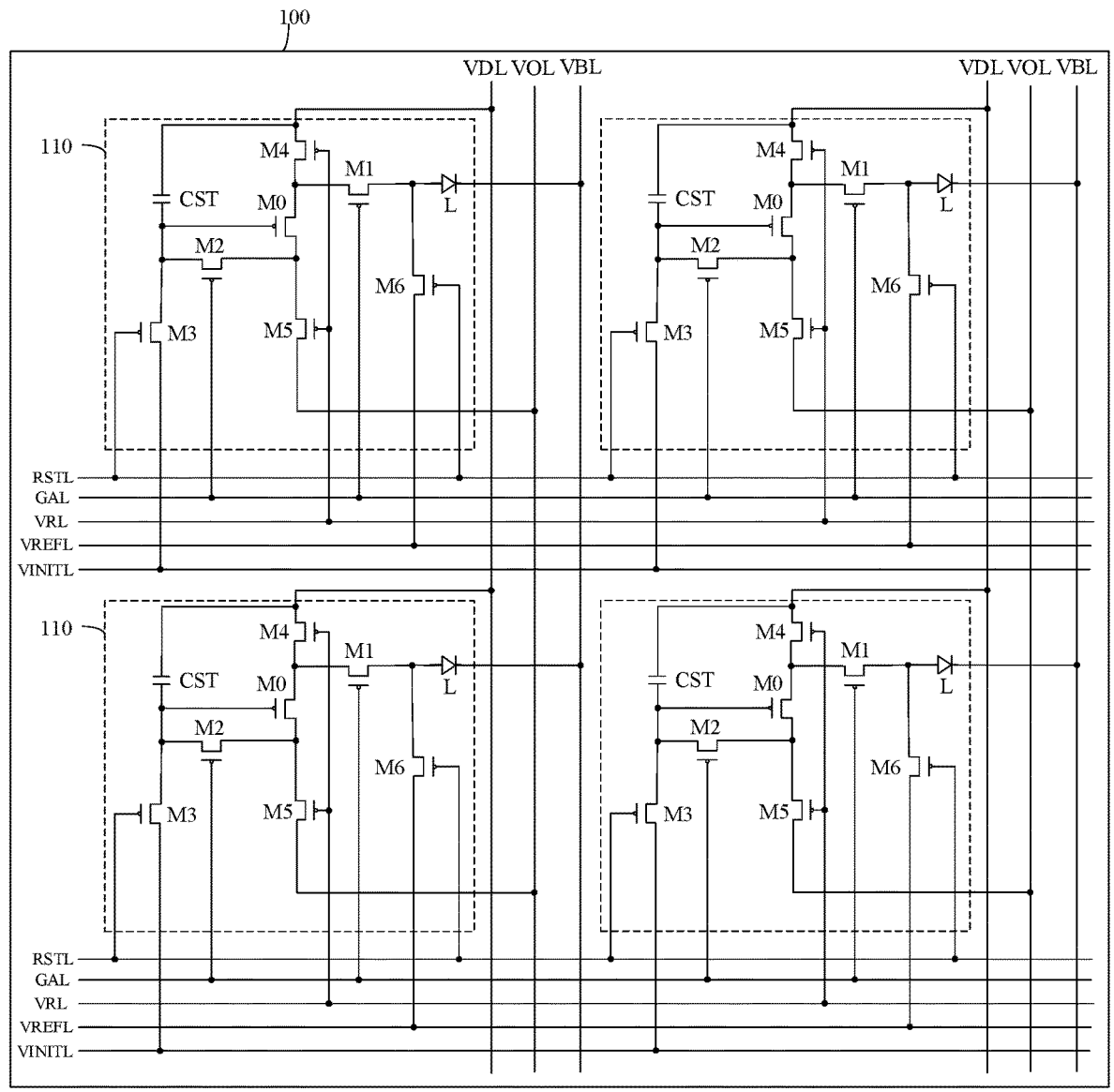
FIG. 6 is a schematic diagram illustrating a specific structure of a photoelectric detection substrate in an embodiment of the present disclosure.

Embodiments of the present disclosure also provide a photoelectric detection substrate, as shown in FIG. 6, which may include: a base substrate 100, a plurality of detection units 110; wherein, the plurality of the detection units 110 are arranged on the base substrate 100 in an array. Each of the detection units includes the photoelectric conversion circuit. It should be noted that the specific structure and operation of the photoelectric conversion circuit can refer to the above-described embodiments, which are not repeated here.

It should be noted that FIG. 6 is schematic by only using the photoelectric conversion circuit illustrated in FIG. 5 as an example.

In some embodiments, the photoelectric detection substrate further includes a plurality of scan signal lines GAL, a plurality of reset control signal lines RSTL, and a plurality of read control signal lines VRL located on the base substrate and spaced apart from one another, as shown in FIG. 6; wherein, one scan signal line GAL, one reset control signal line RSTL, and one read control signal line VRL correspond to one row of detection units. The reset control signal terminals RST of the photoelectric conversion circuits in each row of detection units are electrically connected to a corresponding reset control signal line RSTL, the scan signal terminals GA of the photoelectric conversion circuits in each row of detection units are electrically connected to a corresponding scan signal line GAL, and the read control signal terminals VR of the photoelectric conversion circuits in each row of detection units are electrically connected to a corresponding read control signal line VRL. In this way, a signal can be transmitted to a corresponding electrically connected photoelectric conversion circuit through the reset control signal line RSTL, the scan signal line GAL, and the read control signal line VRL.

Exemplarily, at least two of the scan signal line GAL, the reset control signal line RSTL, and the read control signal line VRL may be arranged in the same layer. In this way, a pattern of the scan signal line GAL, the reset control signal line RSTL, and the read control signal line VRL can be formed by using a one-time patterning process.

In some embodiments of the disclosure, as shown in FIG. 6, the photoelectric detection substrate further includes a plurality of read output lines VOL located on the base substrate and spaced apart from one another; wherein one column of detection units corresponds to one read output line VOL; the read output terminals VOT of the photoelectric conversion circuits in each column of detection units are electrically connected to a corresponding read output line VOL. This can transfer the detection current generated by the driving transistor M0 out through the read output line VOL.

In some embodiments of the present disclosure, as shown in FIG. 6, the photoelectric detection substrate further comprises a plurality of first supply signal lines VDL and a plurality of bias voltage signal lines VBL positioned on the base substrate and spaced apart from one another; wherein a column of detection units correspond to one first power supply signal line VDL and one bias voltage signal line VBL; the first power supply terminals VDD of the photoelectric conversion circuits in each column of detection units are electrically connected to a corresponding first power supply signal line VDL, and the bias voltage signal terminals of the photoelectric conversion circuits in each column of detection units are electrically connected to a corresponding bias voltage signal line VBL. In this way, signals can be transmitted through the first power signal line VDL and the bias voltage signal line VBL to corresponding electrically connected photoelectric conversion circuits.

Exemplarily, at least two of the read output line VOL, the first power supply signal line VDL, and the bias voltage signal line VBL can be arranged in a same layer. In this way a pattern can be formed by using a one-time patterning process.

Embodiments of the present disclosure also provide a photoelectric detection device including the above-described photoelectric detection substrate provided by embodiments of the present disclosure. The principle of solving the problem of the photoelectric detection device is similar to that of the aforementioned photoelectric detection substrate, and thus the implementation of the photoelectric detection device can refer to the implementation of the aforementioned photoelectric detection substrate, and the repetition is not repeated here.

Figure 7:
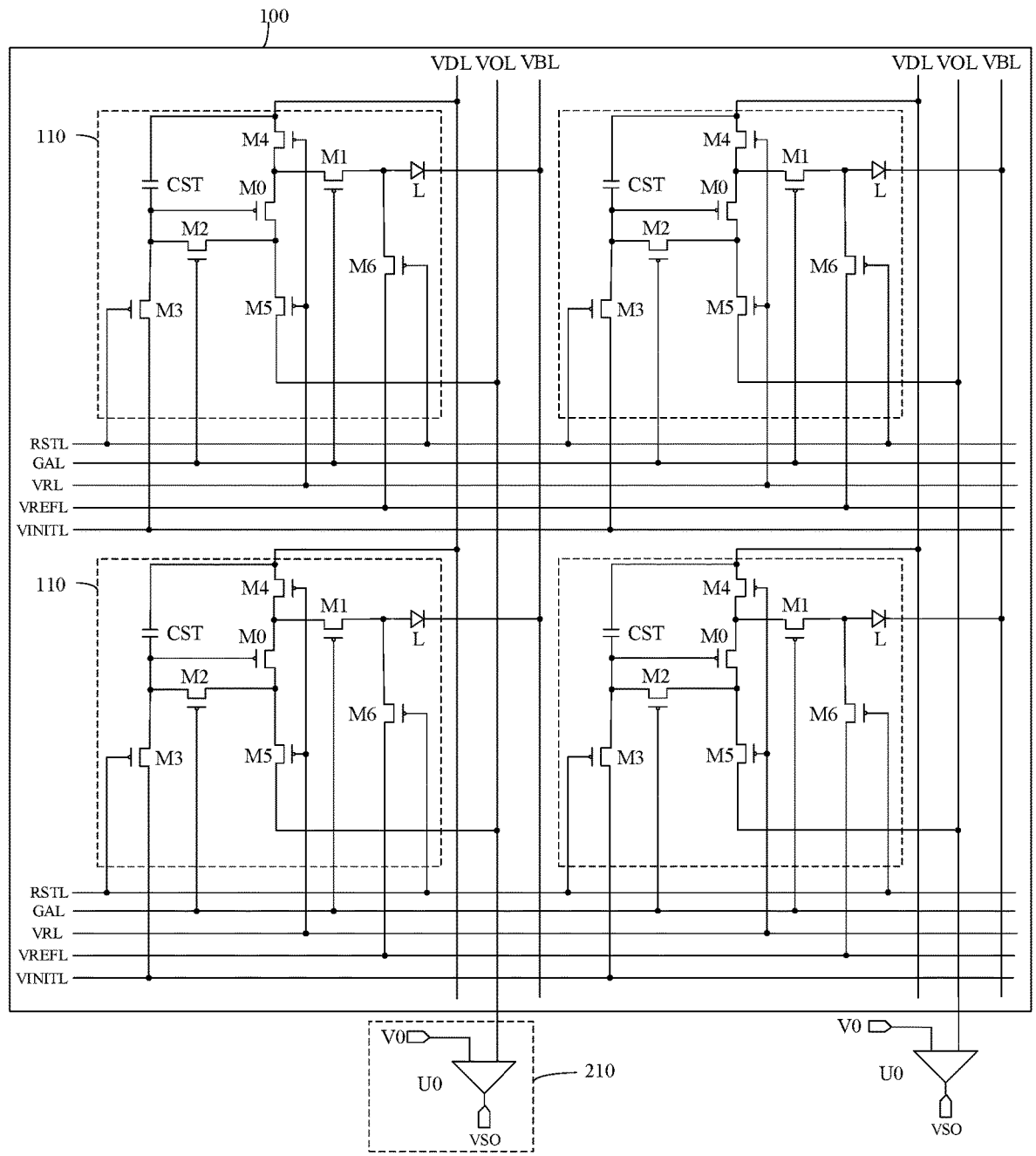
FIG. 7 is a schematic diagram illustrating a specific structure of a photoelectric detection device in an embodiment of the present disclosure.

In some embodiments of the disclosure, as shown in FIG. 7, the photoelectric detection device may further include: a detection circuit; wherein the detection circuit includes a plurality of read circuits 210; one column of detection units corresponds to one read circuit 210; the read output terminals VOT of the photoelectric conversion circuits in each column of detection units are electrically connected to a corresponding read circuit through a read output line VOL.

Exemplarily, the read circuit 210 may include an operational amplifier U0; wherein a first input terminal of the operational amplifier U0 is electrically connected to the corresponding read output line VOL, a second input terminal of the operational amplifier U0 is electrically connected to the reference voltage terminal V0, and an output terminal of the operational amplifier U0 is electrically connected to the data transmission terminal VSO. The data transmission end VSO is electrically connected to a data processing unit. The data processing unit may perform analysis processing according to the signal output by the operational amplifier U0 to achieve output of a detection image.

In some embodiments of the disclosure, the photoelectric detection device may be an image sensor. Exemplarily, the photoelectric detection device may be used for fingerprint detection. For example, the photoelectric detection device can be a mobile phone, a tablet, a television, a display, a laptop, a digital photo frame, a navigator, or any product or component having a display function and a fingerprint detection function. Other essential components to the device will be understood by those of ordinary skill in the art and will not be described herein and should not be taken as a limitation on the present disclosure.

The photoelectric conversion circuit, the driving method, the photoelectric detection substrate, and the photoelectric detection device provided by embodiments may supply a signal of an initialization signal terminal VINIT to the gate of the driving transistor M0 in response to a signal of the reset control signal terminal RST by the first reset circuit 10 to initialize the gate of the driving transistor M0. The threshold voltage of the driving transistor M0 may be compensated by conducting the photoelectric conversion device 50 with the driving transistor M0 in response to the signal at the scan signal terminal GA by the conduction control circuit 20, and conducting the gate of the driving transistor M0 and the second electrode of the driving transistor M0 by the threshold compensation circuit 30 in response to the signal at the scan signal terminal GA. Thereafter, the signal of the read control signal terminal VR may be responded to by the read control circuit 40, the first power supply terminal VDD is conducted with the first electrode of the driving transistor M0, and the second electrode of the driving transistor M0 is conducted with the read output terminal VOT, so that the threshold voltage compensated signal generated by the driving transistor M0 can be output to the read output terminal VOT, which in turn can ameliorate the problem of variability in the output current signal due to the difference in uniformity of the threshold voltage Vth of the driving transistor.

It will be apparent to those skilled in the art that various modifications and variations can be made to the present disclosure without departing from the spirit and scope of the disclosure. Thus the disclosure is also intended to encompass such modifications and variations provided that they fall within the scope of the claims of the invention and their equivalents.

What is claimed is:

1. A photoelectric conversion circuit, comprising:
   a photoelectric conversion device, configured to receive incident light and generate an operating voltage after photoelectric conversion of the incident light;
   a driving transistor, configured to generate a detection current according to the operating voltage photoelectrically converted by the photoelectric conversion device;
   a first reset circuit, configured to supply a signal of an initialization signal terminal to a gate of the driving transistor in response to a signal of a reset control signal terminal;
   a conduction control circuit, configured to conduct the photoelectric conversion device with the driving transistor in response to a signal at a scan signal terminal;
   a threshold compensation circuit, configured to conduct the gate of the driving transistor and a second electrode of the driving transistor in response to the signal at the scan signal terminal; and
   a read control circuit, configured to conduct a first power supply terminal with a first electrode of the driving transistor and conduct the second electrode of the driving transistor with a read output terminal, in response to a signal of a read control signal terminal.

2. The photoelectric conversion circuit according to claim 1, wherein the conduction control circuit comprises: a first transistor; and
   a gate of the first transistor is electrically connected to the scan signal terminal, a first electrode of the first transistor is electrically connected to the photoelectric conversion device, and a second electrode of the first transistor is electrically connected to a first electrode of the driving transistor.

3. The photoelectric conversion circuit according to claim 1, wherein the threshold compensation circuit comprises: a second transistor; and
   a gate of the second transistor is electrically connected to the scan signal terminal, a first electrode of the second transistor is electrically connected to a gate of the driving transistor, and a second electrode of the second transistor is electrically connected to a second electrode of the driving transistor.

4. The photoelectric conversion circuit according to claim 1, wherein the first reset circuit comprises: a third transistor; and
   a gate of the third transistor is electrically connected to the reset control signal terminal, a first electrode of the third transistor is electrically connected to the initialization signal terminal, and a second electrode of the third transistor is electrically connected to the gate of the driving transistor.

5. The photoelectric conversion circuit according to claim 1, wherein the read control circuit comprises: a fourth transistor and a fifth transistor;
   a gate of the fourth transistor is electrically connected to the read control signal terminal, a first electrode of the fourth transistor is electrically connected to the first power supply terminal, and a second electrode of the fourth transistor is electrically connected to a first electrode of the driving transistor; and
   a gate of the fifth transistor is electrically connected to the read control signal terminal, a first electrode of the fifth transistor is electrically connected to a second electrode of the driving transistor, and a second electrode of the fifth transistor is electrically connected to the read output terminal.

6. The photoelectric conversion circuit according to claim 1, further comprising: a storage capacitor; and
   a first electrode plate of the storage capacitor is electrically connected to the first power supply terminal, and a second electrode plate of the storage capacitor is electrically connected to a gate of the driving transistor.

7. The photoelectric conversion circuit according to claim 1, further comprising: a sixth transistor; wherein a gate of the sixth transistor is electrically connected to the reset control signal terminal, a first electrode of the sixth transistor is electrically connected to a reference signal terminal, and a second electrode of the sixth transistor is electrically connected to the photoelectric conversion device.

8. A method for driving the photoelectric conversion circuit according to claim 1, comprising:
   a reset stage of supplying, by the first reset circuit, a signal at an initialization signal terminal to the gate of the driving transistor in response to a signal at a reset control signal terminal;
   a light-detection stage of receiving, by the photoelectric conversion device, incident light and generating an operating voltage after photoelectric conversion of the incident light;
   a threshold compensation stage of conducting, by the conduction control circuit, the photoelectric conversion device with the driving transistor in response to a signal at a scan signal terminal; conducting, by the threshold compensation circuit, the gate of the driving transistor with the second electrode of the driving transistor in response to a signal at a scan signal terminal; and a read output stage of generating, by the driving transistor, a detection current according to an operating voltage photoelectrically converted by the photoelectric conversion device; conducting, by the read control circuit, a first power supply terminal with a first electrode of the driving transistor and conducting the second electrode of the driving transistor with a read output terminal in response to a signal of a read control signal terminal.

9. A photoelectric detection substrate, comprising: a base substrate and a plurality of detection units; wherein the plurality of detection units are arranged on the base substrate in an array; and each of the detection units comprises a photoelectric conversion circuit, wherein the photoelectric conversion circuit comprises:

a photoelectric conversion device, configured to receive incident light and generate an operating voltage after photoelectric conversion of the incident light;

a driving transistor, configured to generate a detection current according to the operating voltage photoelectrically converted by the photoelectric conversion device;

a first reset circuit, configured to supply a signal of an initialization signal terminal to a gate of the driving transistor in response to a signal of a reset control signal terminal;

a conduction control circuit, configured to conduct the photoelectric conversion device with the driving transistor in response to a signal at a scan signal terminal;

a threshold compensation circuit, configured to conduct the gate of the driving transistor and a second electrode of the driving transistor in response to the signal at the scan signal terminal; and a read control circuit, configured to conduct a first power supply terminal with a first electrode of the driving transistor and conduct the second electrode of the driving transistor with a read output terminal, in response to a signal of a read control signal terminal.

10. The photoelectric detection substrate according to claim 9, wherein the conduction control circuit comprises: a first transistor; and a gate of the first transistor is electrically connected to the scan signal terminal, a first electrode of the first transistor is electrically connected to the photoelectric conversion device, and a second electrode of the first transistor is electrically connected to a first electrode of the driving transistor.

11. The photoelectric detection substrate according to claim 9, wherein the threshold compensation circuit comprises: a second transistor; and a gate of the second transistor is electrically connected to the scan signal terminal, a first electrode of the second transistor is electrically connected to a gate of the driving transistor, and a second electrode of the second transistor is electrically connected to a second electrode of the driving transistor.

12. The photoelectric detection substrate according to claim 9, wherein the first reset circuit comprises: a third transistor; and a gate of the third transistor is electrically connected to the reset control signal terminal, a first electrode of the third transistor is electrically connected to the initialization signal terminal, and a second electrode of the third transistor is electrically connected to the gate of the driving transistor.

13. The photoelectric detection substrate according to claim 9, wherein the read control circuit comprises: a fourth transistor and a fifth transistor;

a gate of the fourth transistor is electrically connected to the read control signal terminal, a first electrode of the fourth transistor is electrically connected to the first power supply terminal, and a second electrode of the fourth transistor is electrically connected to a first electrode of the driving transistor; and a gate of the fifth transistor is electrically connected to the read control signal terminal, a first electrode of the fifth transistor is electrically connected to a second electrode of the driving transistor, and a second electrode of the fifth transistor is electrically connected to the read output terminal.

14. The photoelectric detection substrate according to claim 9, wherein the photoelectric conversion circuit further comprises: a storage capacitor; and a first electrode plate of the storage capacitor is electrically connected to the first power supply terminal, and a second electrode plate of the storage capacitor is electrically connected to a gate of the driving transistor.

15. The photoelectric detection substrate according to claim 9, wherein the photoelectric conversion circuit further comprises: a sixth transistor; wherein a gate of the sixth transistor is electrically connected to the reset control signal terminal, a first electrode of the sixth transistor is electrically connected to a reference signal terminal, and a second electrode of the sixth transistor is electrically connected to the photoelectric conversion device.

16. The photoelectric detection substrate according to claim 9, further comprising a plurality of scan signal lines, a plurality of reset control signal lines, and a plurality of read control signal lines positioned on the base substrate and spaced apart from one another; wherein one row of the detection units correspond to one scan signal line, one reset control signal line, and one read control signal line;

reset control signal terminals of the photoelectric conversion circuits in each row of the detection units are electrically connected to a corresponding reset control signal line;

scan signal terminals of the photoelectric conversion circuits in each row of the detection units are electrically connected to a corresponding scan signal line; and read control signal terminals of the photoelectric conversion circuits in each row of the detection units are electrically connected to a corresponding read control signal line.

17. The photoelectric detection substrate according to claim 9, further comprising a plurality of read output lines arranged on the base substrate and spaced apart from one another; wherein one column of the detection units correspond to one read output line; and read output terminals of the photoelectric conversion circuits in each column of the detection units are electrically connected to a corresponding read output line.

18. A photoelectric detection device, comprising the photoelectric detection substrate according to claim 9.

19. The photoelectric detection device according to claim 18, further comprising: a detection circuit;

the detection circuit comprises a plurality of read circuits; wherein a column of the detection units correspond to one of the read circuits; and read output terminals of photoelectric conversion circuits in each column of the detection units are electrically connected to a corresponding read circuit through a read output line.

* * * * *